(12) United States Patent
Nakano et al.

(10) Patent No.: US 7,060,355 B2
(45) Date of Patent: Jun. 13, 2006

(54) POLYCRYSTALLINE SILICON ROD AND METHOD OF PROCESSING THE SAME

(75) Inventors: Mamoru Nakano, Yokkaichi (JP); Yukio Yamaguchi, Yokkaichi (JP); Teruhisa Kitagawa, Yokkaichi (JP); Rikito Sato, Yokkaichi (JP); Naoki Hatakeyama, Yokkaichi (JP)

(73) Assignee: Mitsubishi Materials Polycrystalline Silicon Corporation, Yokkaichi (JP)

( * ) Notice: Subject to any disclaimer, the term of this patent is extended or adjusted under 35 U.S.C. 154(b) by 0 days.

(21) Appl. No.: 10/296,230

(22) PCT Filed: Jun. 1, 2001

(86) PCT No.: PCT/JP01/04636

§ 371 (c)(1),
(2), (4) Date: May 15, 2003

(87) PCT Pub. No.: WO01/94669

PCT Pub. Date: Dec. 13, 2001

(65) Prior Publication Data

US 2003/0183162 A1  Oct. 2, 2003

(30) Foreign Application Priority Data

Jun. 5, 2000 (JP) ............................. 2000-167402
Jul. 14, 2000 (JP) ............................. 2000-214430

(51) Int. Cl.
*C01B 33/00* (2006.01)
*C30B 29/06* (2006.01)

(52) U.S. Cl. ............... 428/397; 428/446; 117/911; 423/348

(58) Field of Classification Search ............... 428/364, 428/397, 596, 446, 348; 117/911, 921, 932
See application file for complete search history.

(56) References Cited

U.S. PATENT DOCUMENTS

| | | | |
|---|---|---|---|
| 5,888,293 A | | 3/1999 | Fujiyama et al. ............. 117/13 |
| 5,948,164 A | * | 9/1999 | Iida et al. .................... 117/218 |
| 6,183,556 B1 | * | 2/2001 | Aydelott et al. ............. 117/218 |
| 6,197,108 B1 | * | 3/2001 | Iino et al. ...................... 117/13 |
| 6,444,028 B1 | * | 9/2002 | Frauenknecht et al. ..... 117/218 |

FOREIGN PATENT DOCUMENTS

| | | | |
|---|---|---|---|
| JP | 08310892 A | * | 11/1996 |
| JP | 9-255467 | | 9/1997 |
| JP | 2000-313690 | | 11/2000 |

* cited by examiner

*Primary Examiner*—Stephen Stein
(74) *Attorney, Agent, or Firm*—Oblon, Spivak, McClelland, Maier & Neustadt, P.C.

(57) ABSTRACT

A polycrystalline silicon rod according to present invention has a structure for hanging of polycrystalline silicon rods to each other end-to-end, so that the efficiency of melting polycrystalline silicon can be increased considerably. A polycrystalline silicon rod obtained by entirely or partially removing a peripheral portion from the rod to leave a central portion, and processing the central portion, preferably, the peripheral portion is removed by grinding in an amount corresponding to 10 to 60% of the diameter of the rod, and then subjected to groove-forming processing. This makes annealing unnecessary.

6 Claims, 6 Drawing Sheets

POLYCRYSTALLINE SILICON ROD AND METHOD OF PROCESSING THE SAME

This application is a 371 of application of PCT/J01/04636 filed Jun. 1, 2001, which claims priority to Japanese Patent Application 2000-167402 filed Jun. 5, 2000 and 2000-214430 filed Jul. 14, 2000.

1. Technical Field

The present invention relates to a polycrystalline silicon rod having a coupling structure and to a method of processing the same. More particularly, the present invention relates to a polycrystalline silicon rod having a structure that enables hanging of polycrystalline silicon rods to each other end-to-end safely and easily, and to a method of processing such polycrystalline silicon rods, in which groove-forming etc. can be made stably without performing annealing treatment. Hereinafter, the term "polycrystalline silicon rod" may sometimes be abbreviated simply as a silicon rod including both of them.

2. Background Art

Recently, monocrystalline silicon is produced mainly by the Czhochralski process (CZ process). This process dips a seed crystal in a melt composed of molten polycrystalline silicon to allow monocrystalline silicon to grow around the seed crystal while drawing up the seed crystal gradually in accordance with the growth to produce a monocrystalline silicon rod. Usually, in order to facilitate its handling, the raw material polycrystalline silicon is cut into cylinders of about 70 cm in length, and the mass (called silicon rods) is charged in a crucible for melting and is molten therein. In this case, in order to increase the efficiency of melting, it is generally performed to suspend a silicon rod and introduce it into the remainder of a melt.

Heretofore, a silicon rod provided with a groove on the periphery thereof near its top is suspended by engaging it with a wire in the groove. As a result, the rod excluding the upper portion thereof, i.e., from a position several centimeters below the groove to the top of the rod is molten, so that the efficiency of melting is insufficient. In the case where many silicon rods are to be molten, each of the steps of attaching a wire to the rod, charging the rod into a silicon melt, and drawing up the remaining part of the rod must be repeated several times. This disadvantageously decreases the efficiency of melting operation considerably. To cope with this, a process for simultaneously suspending a plurality of silicon rods has been proposed (cf. JP-A-09-255467). However, this process is not free of the defect in that the upper portion from a position neighboring the groove in the periphery of the rod to its upper end makes a melting loss. In addition, a process is known in which silicon rods are each provided with grooves around its periphery on both upper and lower ends, respectively, two such rods are butted end-to-end, and an annular member having a U-shape cross-section is inserted into the upper and lower grooves to couple the rods to each other (cf. JP-A-08-310892). However, this process has the problem of instability since it uses a coupling member that is inserted from outside in the groove on the rod on its top to engage it therein so that the coupling member could be disengaged when it would happen to be in contact with the exterior when the coupled rods are being transported or fitted to the melting apparatus.

In the case where a silicon rod made of polycrystalline silicon is processed so as to have a conventional suspending structure in its end portion, annealing treatment intended to decrease residual stress must be practiced to the rod in order to process it without damages. When a polycrystalline silicon rod is produced from trichlorosilane and hydrogen as the raw materials by the Siemens method, a temperature difference of 100° C. or more occurs between the central part of the rod and the surface part of the rod. This causes a difference in stress between the central part and the surface part, which difference in stress remains in the rod as residual stress after completion of the reaction. Accordingly, if the rod is processed to provide therein a groove without performing annealing treatment in advance, cracks tend to occur in the rod by residual stress, thereby damaging the processed portion of the rod. On the contrary, if the annealing treatment is practiced, contamination of metals from the heating source occurs unavoidably so that the purity of polycrystalline silicon is decreased. Further, the anneal treatment needs heating at about 1,200° C., which is not only troublesome but also requires of an appliance that can afford to practice high temperature heating.

DISCLSURE OF THE INVENTION

The present invention is devoted to solve such problems as described above, and an object of the present invention is to provide a structure that can enable stable and easy hanging silicon rods each other.

Another object of the present invention is to provide a method of processing silicon rods in a stable manner without performing annealing treatment when such a coupling structure is to be processed.

The present invention provides a silicon rod having the following structure and method of processing it.

That is, the present invention relates to a polycrystalline silicon rod having a structure for hanging of silicon rods to each other end-to-end, wherein an engaging groove is formed on both end face of the rods facing to each other, the engaging groove is defined by a slit having a narrow width and an inner space larger than the width of the slit, said slit is open on an end face of the rod and said inner space is open on a side face of the slit is receiving a coupling member having both and portions, the coupling member having both ends part larger than the width of the slit is received into said engaging groove, slit is open on an end face of the rod, said inner space is open on a side face of the rod for receiving a coupling member having both ends portions, said coupling member received into the engaging groove is passed through the open slit to become the state bridging over both rods, both end portions of the coupling member fitted into the said inner space is engaged with the slit to become the state stopping the passing through, and the silicon rods is passed through the coupling member.

The present invention also relates to the above-mentioned polycrystalline silicon rod having the structure for hanging of silicon rods to each other end-to-end, wherein the entire or a part of a peripheral portion, or both shoulder portions of the rod, are removed to leave a central portion, the engaging groove being defined a slit having a narrow width and an inner space larger than the width of the slit is formed in the central portion, and the coupling member having both ends part larger than the width of the slit is received into said engaging groove.

The present invention also relate to the above-mentioned polycrystalline silicon rod, wherein the peripheral portion in an amount corresponding to 10 to 60% of a diameter of the rod end portion, a part of the peripheral portion, or both shoulder portions, are removed to leave the central portion, and said engaging groove is formed in the central portion.

The present invention also relate to the above-mentioned polycrystalline silicon rod, wherein the engaging groove has an inner space having a spherical, polygonal or dovetail groove-like shape.

The present invention also relate to the above-mentioned polycrystalline silicon rod, wherein a taper is formed on the boundary portion between the slit and the inner space of the engaging groove.

The present invention also relates to a method of processing the above-mentioned polycrystalline silicon rod, wherein both shoulder portion of a rod end portion are removed to leave the of the central portion is formed therein.

A polycrystalline silicon rod according to the present invention has a structure for hanging of polycrystalline silicon rods to each other end-to-end, wherein an engaging groove is formed on at least one end face of the rods facing to each other, the engaging groove being defined by a slit having a narrow width and an inner space larger than the width of the slit, being open on an end face of the rod and on a side face of the rod, and being adapted for receiving a coupling member having both end portions larger than the width of the slit, whereby being capable of coupling the rods by fitting the coupling member into the respective engaging grooves of the rods facing to each other. Employment of this coupling structure eliminates a fear that the coupling member easily comes off, and enables to engage the rods with stably and ease.

Further, according to the processing method of the present invention, a polycrystalline silicon rod can be subjected to groove-forming processing without annealing treatment at high temperature, thereby being capable of preventing the contamination of metals due to the high temperature heating. This makes the apparatus for heating unnecessary, thereby being capable of processing speedily. Thus, the polycrystalline silicon rod subjected to the processing of the present invention minimizes the contamination of metals to obtain high purity.

BRIEF DESCRIPTION OF THE DRAWINGS

FIG. 7 and FIG. 8 show processes for processing silicon rods to have other shapes according to the present invention, in which FIG. 7 is a schematic appearance of a top end of the rod; FIGS. 8 are diagrams showing plane, front and side faces of the rod shown in FIG. 7;

BEST MODE FOR CARRYING OUT THE INVENTION

Figure 1:
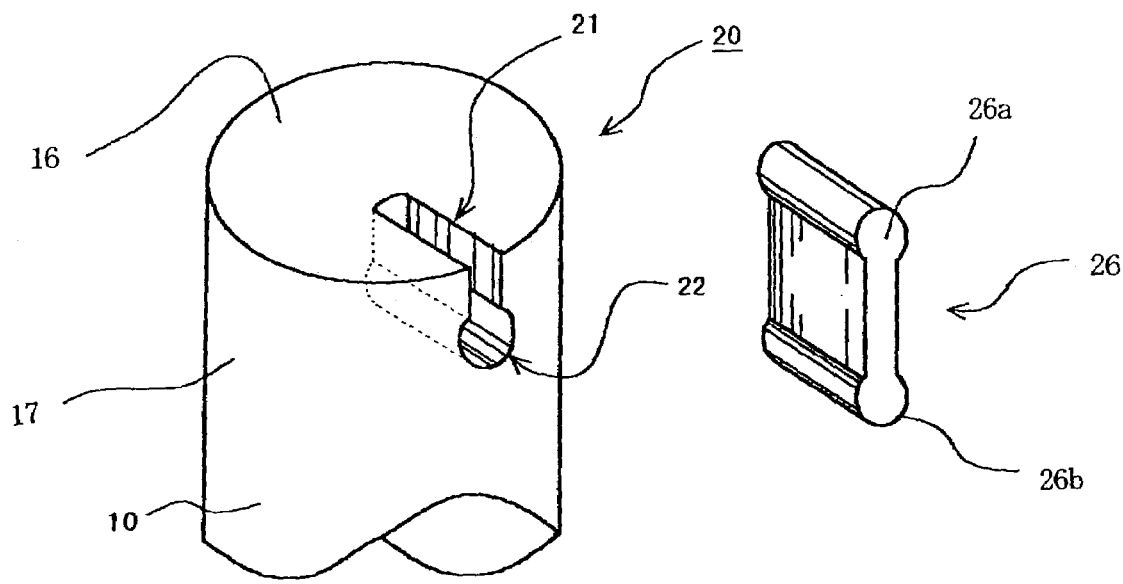
FIG. 1, FIG. 2, and FIG. 3 are partial views showing appearances of coupling structure portions of a silicon rod.

Hereinafter, the present invention will be described in detail by embodiments with reference to the attached drawings.

As illustrated, a silicon rod 10 of the present invention is provided with an engaging groove 20 in at least one end portion thereof. The engaging groove is constituted by a slit 21 and an inner space 22. The slit 21 is a narrow groove, which opens on an end surface 16 and a side surface 17 of rod and extends toward the inside of the rod. The inner space 22 is integrally formed in communication with the inwardly extending slit 21. The inner space 22 is formed wider in width than that of the groove of the slit 21, so that the space communicating with the rod end surface 16 is formed narrow by the slit 21. The inner space 22 at its side end opens on the side surface 17.

Figure 2:
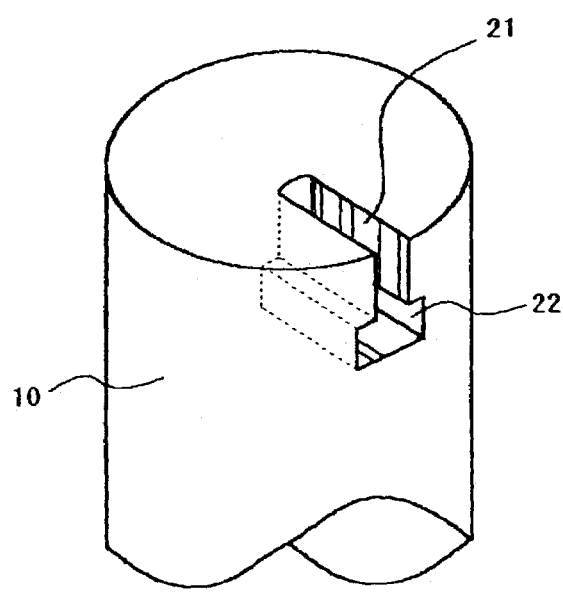
Figure 3:
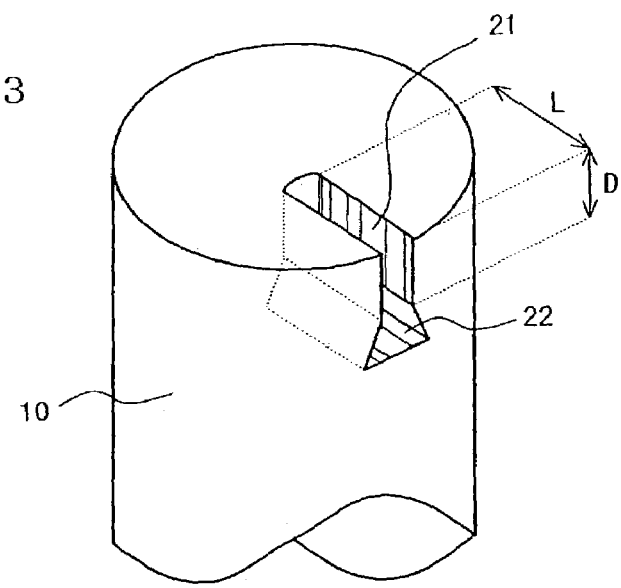

The inner space 22 shown in FIG. 1 is formed in the form of a cylinder. However, the shape of the inner space 22 is not particularly limited thereto. As shown in FIGS. 2 and 3, the shape of opening on the rod side surface 17 may be polygonal or in the form of a dovetail groove or any other shape as far as its width is greater than the width of the slit. The depth (D) of the slit 21, that is, the length of the slit 21 until it reaches the inner space 22 is optional. In the case where the inner space 22 is cylindrical or in the form of a dovetail groove as shown in FIG. 1 or 2, the depth (D) of the slit 21 may be set to substantially zero (0) so that a portion of the inner space 22 can directly open on the rod end surface 16. Furthermore, the length (L) of the slit 21 and inner space 22 is optional and may be any dimension as far as the coupling member 26 can securely be engaged in the engaging groove 26. Note that, in the example shown in the figure, the length (L) of the slit 21 and inner space 22 is set so that they reach near the axis of the rod 10. However, that length (L) may be set to a dimension so that they can extend horizontally across the rod along a diameter thereof. Thus, the coupling structure of the present invention may also include the structure in which a portion of the inner space 22 directly opens on the rod end surface 16 or the structure in which the slit or inner space extends through the rod.

Figure 4:
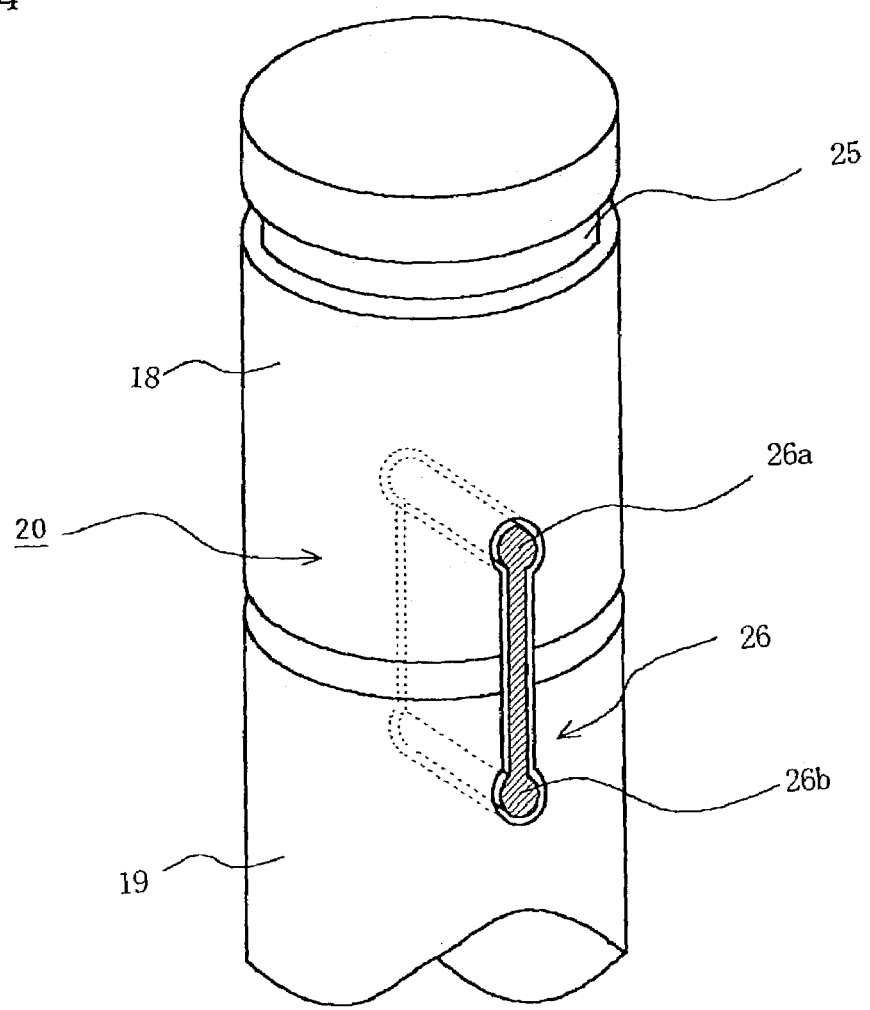
FIG. 4 shows a partial appearance of coupling state of silicon rods, which are coupled vertically.

The engaging groove 20 is formed at least one end portion of the silicon rod. As shown in FIG. 4, a silicon rod 18 to be attached to a wire (not shown) suspending a rod of a melting apparatus is provided with a groove 25 for winding a wire around it and with the above-described engaging groove 20 in the lower end portion of the rod. A silicon rod 19 to be coupled to the silicon rod 18 is provided with the engaging groove 20 according to the present invention in its upper end portion. Into the engaging groove 20 is inserted a coupling member 26. The coupling member 26 is formed so as to have a greater width on its both end portions 26a and 26b than the width of the slit as is illustrated. The end portions 26a and 26b of the coupling member 26 are inserted into the engaging grooves 20, 20 of the silicon rods 18 and 19, respectively, from the openings on the side surfaces thereof to fit them thereinto. This makes the coupling member 26 to be fitted through the openings in the end surfaces of the rods so that it can bridge the both silicon rods.

The end portions 26a and 26b of the coupling member 26 are made wider than the width of the slit so that the end portions 26a and 26b are engaged in the end portions of the slits against the force exerted in the direction along the axis of the rod (force directed toward the end surface), which prevents the coupling member 26 from coming off from the engaging groove 20. As a result, the silicon rods can be coupled to each other in a stable manner. Since the engaging groove 20 opens on the rod side surface, the coupling member 26 can be inserted in the engaging groove 20 with ease and also detached therefrom with ease. Furthermore, since the coupling rod 26 is engaged in the inside of the rod, there is no fear that the engaged portion contacts the exterior to be disengaged when the coupled rods are handled.

FIG. 4 illustrates an example of two silicon rods coupled end-to-end vertically but the coupling structure of the present invention is not limited thereto. For example, a plurality of silicon rods can be coupled and suspended as follows. That is, more than two silicon rods are prepared, each of which is provided with the above-described engaging groove 20 on each of the upper and lower end portions of the silicon rod, the silicon rods are coupled end-to-end through the engaging grooves 20. Then, the coupled silicon rods are suspended vertically. The coupling structure of the present invention can be advantageously applied to silicon-silicon rods and in this case it is preferred that the coupling member made of silicon be used.

By using the above-described coupling structure, a plurality of silicon rods can be coupled end-to-end and suspended vertically so that the efficiency of melting polycrystalline silicon can be increased considerably. Since the coupling structure of the present invention is engaged in the inside of the rod, the state of engagement is stable and further, the operation is easy since the coupling member can be inserted for engagement from the side surface of the rod.

Next, the processing process of the present invention and the silicon rod subjected to the processing process will be described based on the illustrated embodiment.

Figure 9:
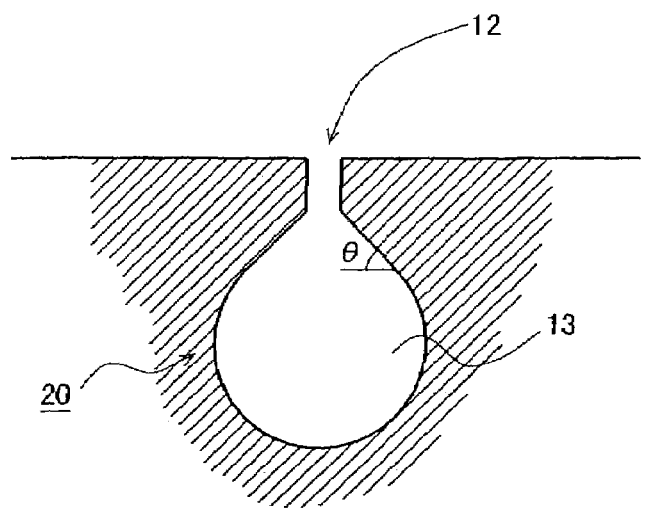
FIG. 9 is a cross-sectional view showing an engaging groove processed by the process of the present invention.
Figure 10:
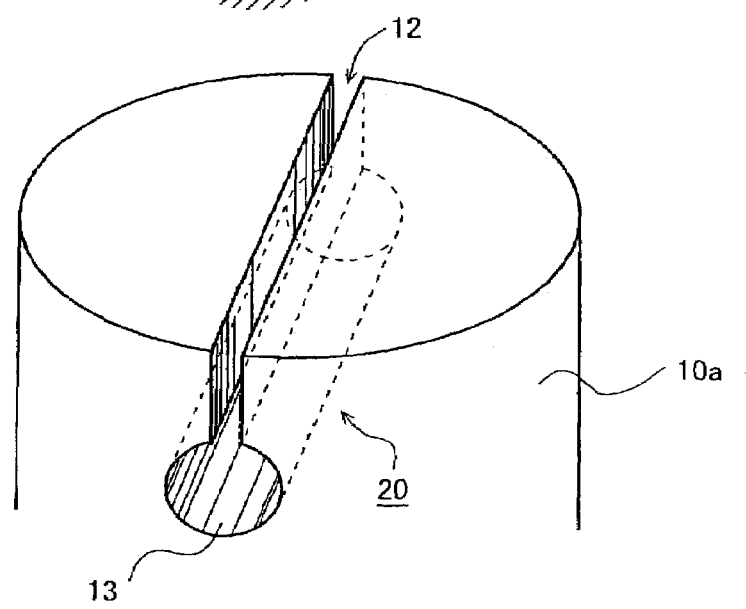
FIG. 10 shows a perspective appearance of the engaging groove processed by the method of the present invention.
Figure 11:
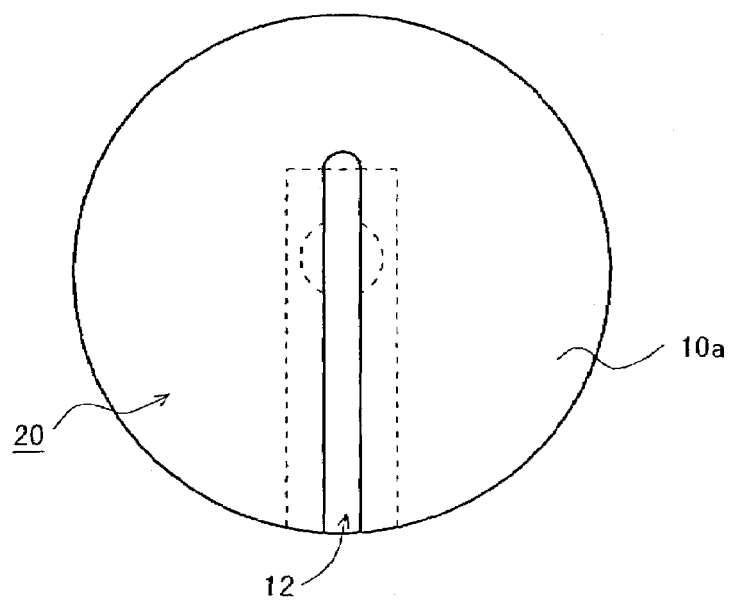
FIG. 11 is a plan view showing the engaging groove processed by the method of the present invention.
Figure 12:
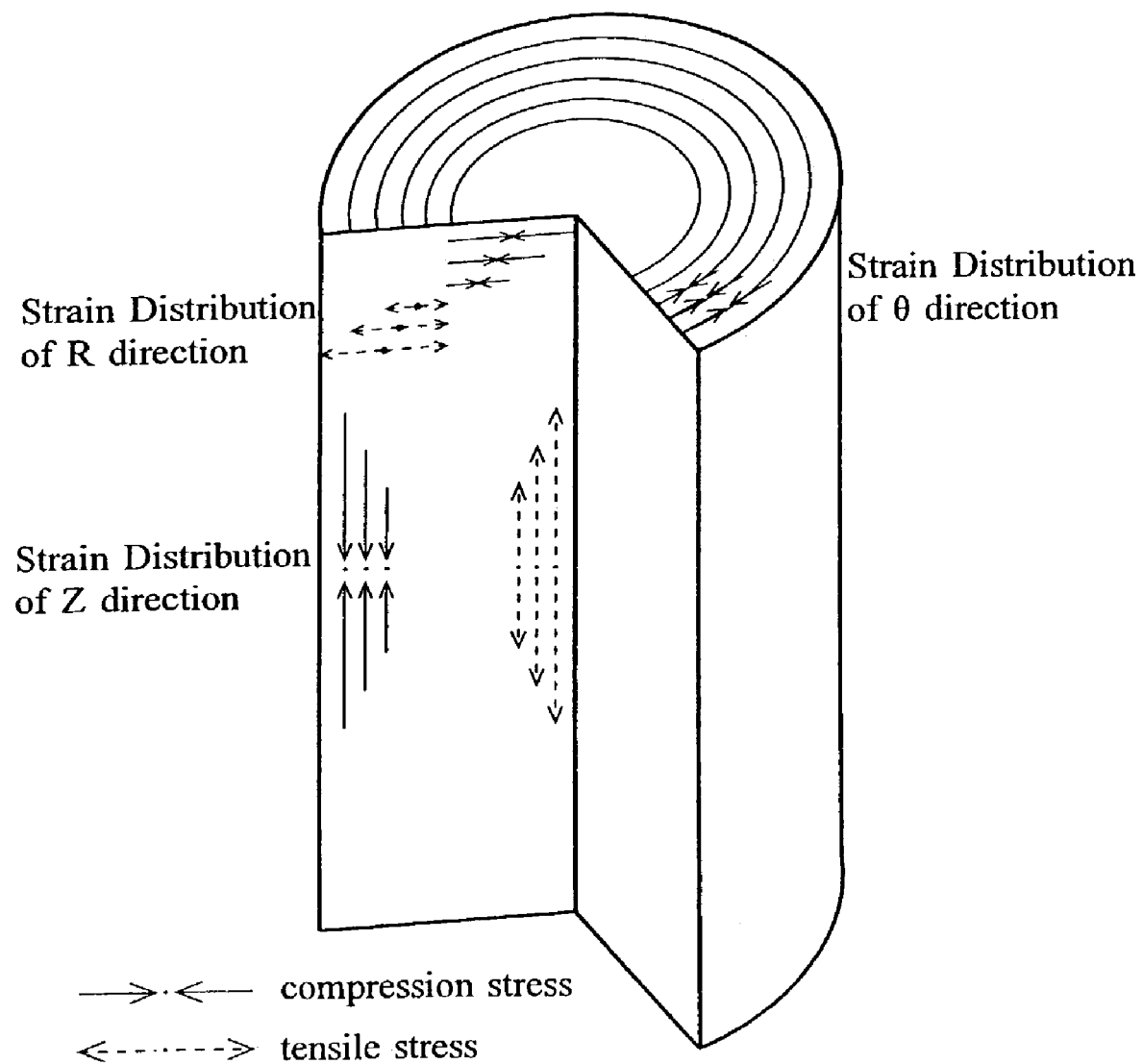
FIG. 12 is a diagram illustrating distribution of residual stress in the inside of a polycrystalline silicon rod.

FIGS. 5 to 8 are diagrams illustrating the processing process of the present invention. FIGS. 9 to 11 are cross-sectional view, partial perspective view and plan view, respectively, showing the shape of groove (hole). FIG. 12 is a schematic diagram illustrating distribution of residual stress in the rod.

The processing process of the present invention and the rod subjected thereto are featured by removing a peripheral portion of the polycrystalline rod entirely or partially and subjecting the remaining central portion thereof to processing. More particularly, for example, the peripheral portion of the rod end portion is cut round along the peripheral surface to leave a cylindrical central portion or both shoulder portions of a rod end portion is cut off to leave a protruded strip-like central portion, and then the remaining central portion is processed to provide an engaging groove and the like.

When a polycrystalline silicon rod is produced by the Siemens process, in which trichlorosilane and hydrogen as the raw materials are introduced in a sealed vessel and the raw material gases are contacted with the surface of a silicon seed rod heated to a high temperature by application of electric current to thermally decompose the trichlorosilane, thereby depositing silicon, the central portion of the rod has a temperature higher than that of the surface of the rod, so that there is generated a difference in temperature as large as 100° C. or more. This results in a difference in stress between the central portion and the surface portion, which difference remains in the rod as residual stress after completion of the reaction.

More particularly, as shown in FIG. 12, always a compression stress is exerted in the circumferential direction (direction θ), whereas in the radial direction (direction r) a compression stress is exerted in the central portion of the rod but a tensile stress is exerted in the peripheral portion of the rod. On the other hand, in the axial direction (direction z), a tensile stress is exerted in the central portion of the rod but a compression stress is exerted in the peripheral portion of the rod. In the presence of such residual stresses, if the upper end portion of a silicon rod is processed to form a groove, a tensile stress is exerted in the range of the in the radial direction (direction r) so that cracks tend to occur in the radial direction and the rod could be broken easily.

Figure 6:
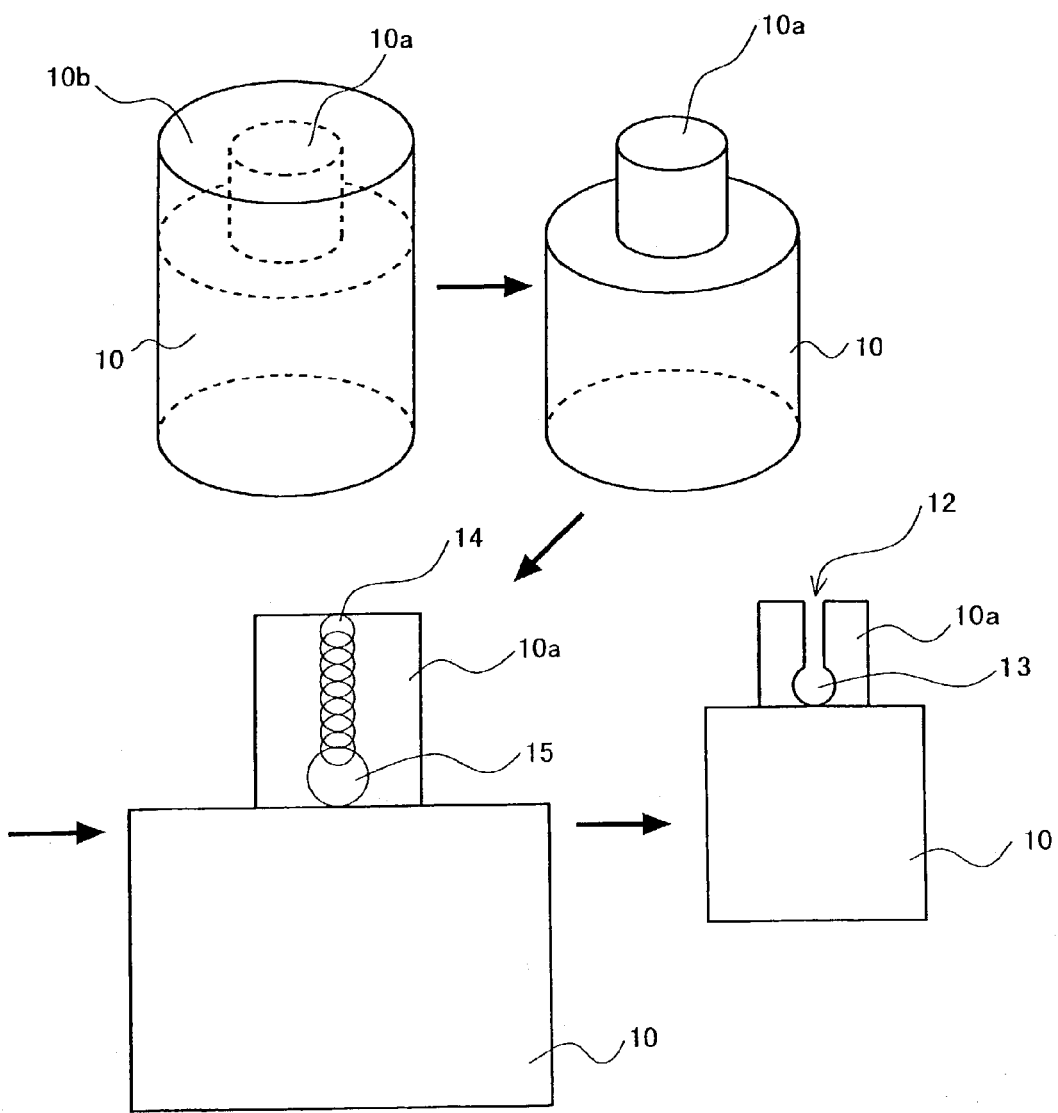
FIG. 6 is a diagram illustrating a procedure of processing process of the present invention.
Figure 7:
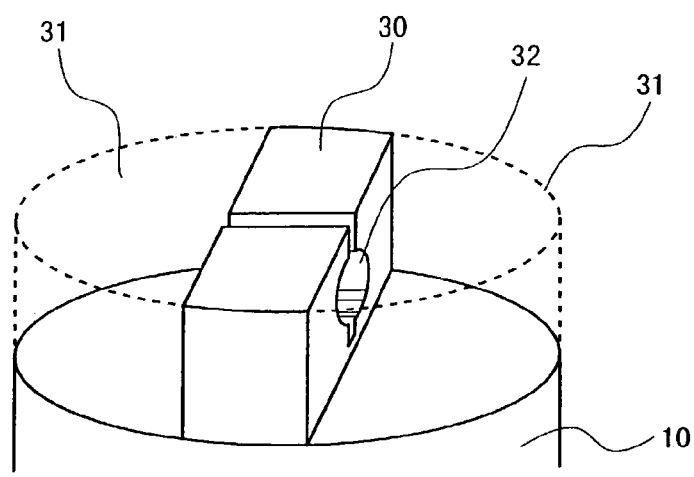

Accordingly, in the present invention, making the best of the fact that always a compression stress is exerted in the circumferential direction, the peripheral portion 10*b* of the rod 10 is removed along the circumferential direction as shown in FIG. 6 to decrease the tensile stress in the radial direction. Alternatively, as shown in FIG. 7, a part of the peripheral portion of the rod end portion, that is, both shoulder portions 31 of the rod end portion is cut off to decrease the tensile stress in the radial direction. The portion to be removed is suitably a portion corresponding to 10 to 60% of the diameter. The central portion 10*a* or 30 left after the removal of the peripheral portion is mostly in the region where a compression stress is exerted, so that it will not be cracked when it is subjected to processing. The removed portion of less than 10% of the diameter of the rod is not desirable since the portion of tensile stress remains to such an extent that the influence of tensile stress cannot be excluded sufficiently. On the other hand, the removed portion of above 60% is not suitable since the central portion to be further processed is too small.

Figure 5:
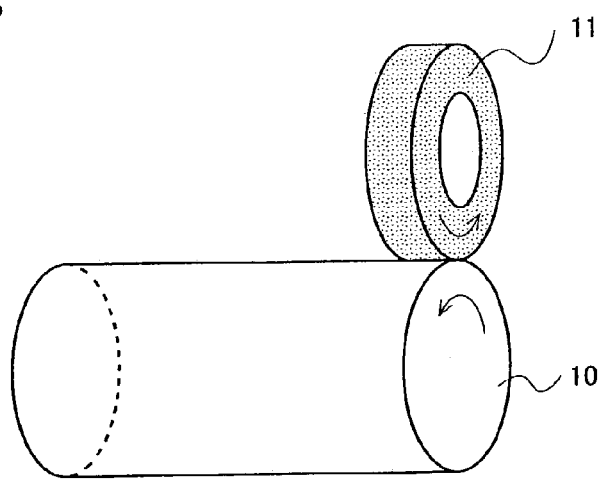
FIG. 5 is a diagram illustrating a state initiating a processing process of the present invention.

An example of processing process is illustrated in FIGS. 5 to 8. As shown in FIG. 5, a diamond wheel (i.e., a cutter provided with a diamond coating on the periphery) is applied to the periphery at an end portion of the polycrystalline silicon rod (silicon rod) 10. Then the rod 10 and wheel 11 are rotated in reverse directions to polish the peripheral portion 10*b* of the rod 10 to remove it. The length of the ground portion 10*b* in the axial direction may be determined properly depending on the shape and depth of the groove to be processed. The method for removing the peripheral portion is not limited to grinding and other methods, for example, a method of cutting off the portion surrounding the peripheral portion using a diamond saw or the like and then optionally grinding the resultant circumferential surface using a diamond wheel to obtain a smooth surface may be used.

Next, the central portion 10*a* after the centering is subjected to groove forming processing. More particularly, for example, the central portion 10*a* is drilled using a drill of a small diameter in the radial direction to bore a hole 14 of a small diameter. This operation is repeated in the axial direction from the upper end surface of the central portion 10*a* to the lower portion of the ground portion to form a groove (slit) 12 communicating vertically. Then using a drill 15 of larger diameter, a hole 13 is bored on the bottom portion of the groove (slit) 12 extending in the same direction to form an engaging groove 20 including an inner space 13 larger than the groove (slit) 12 and communicating therewith.

Figure 8:
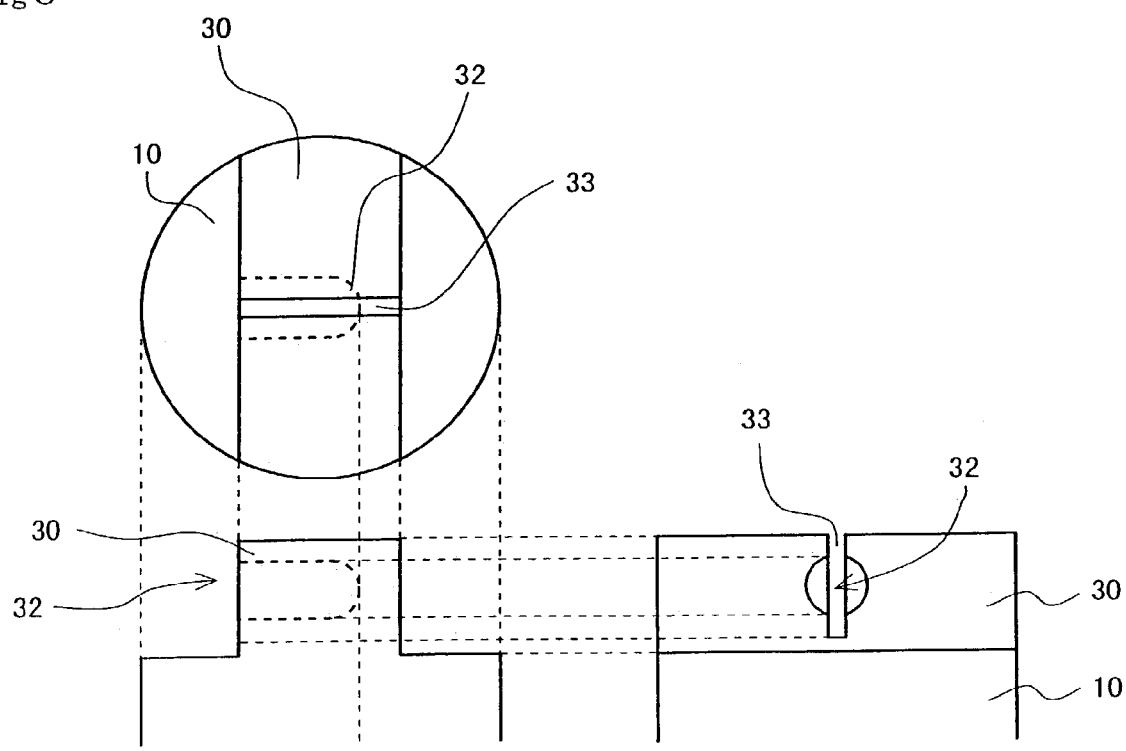

Furthermore, as shown in FIGS. 7 and 8, the peripheral portion of the rod end portion may be removed. More particularly, the shoulder portions 31 on the both sides of the upper end portion of the rod 10 are removed to leave a central portion 30. In the cut surface of the central portion 30 is provided an engaging groove 32, through which a slit 33 of a narrower width is integrally formed vertically. The engaging groove 32 may be provided as passing through the central portion 30 or as is shown in FIG. 8, it does not penetrate the central portion 30 but may be formed partway.

As described above, the engaging grooves 20 and 32 are formed by slits 12 and 33 and inner space (hole). The passage leading to the upper end surface of the rod is formed by the slits 12 and 33, which are narrower, and the inner space from the bottom portion of the slit to the central portion is formed larger. The inner space (hole) opens on the side surface of the rod. In the example illustrated, the inner space of the engaging grooves 20 and 30 are formed cylindrical. However, they may be polygonal or dovetail shape in cross section. Also, any other shapes may be used as far as they are wider than the slits 12 and 33. The depth (length to the inside of the engaging groove) and length in the radial direction of the slits 12 and 33 are optional and may be any dimension as far as the coupling member can be firmly fitted in the engaging grooves 20 and 30. As shown in FIG. 9, the border portion between the groove (slit) 12 and the inner space may preferably be of a structure that can prevent damages of a corner portion by providing a taper θ with the corner portion.

What is shown in FIG. 10 is an example of the shape of the rod end portion as shown in FIG. 6, in which the engaging groove 20 passes through the central portion 10*a* of the rod in the radial direction. The length of the engaging groove 20 in the radial direction may be partway of the central portion 10*a* as shown in FIG. 11.

The engaging grooves 20 and 30 as described above are formed in at least one end portion of the silicon rod 10, or in both opposing end surfaces of a pair of silicon rods butted one against another and the rods are coupled to each other end-to-end by means of a coupling member (not shown) that is fitted in the engaging grooves 20 and 30 and the coupled rods are suspended. The coupling member has both ends larger than the width of the slits 12 and 33, and the end portions thereof are inserted in the engaging grooves 20 and 30 in the silicon rods, respectively. Since the end portions of the coupling member are each greater than the width of the slits, the end portions can couple the silicon rods 10 to each other without coming off from the slit groove. Since the engaging grooves 20 and 30 are opened toward the side surface of the rod, the coupling member can be inserted in the engaging grooves 20 and 30 with ease and also detached with ease. Furthermore, since the coupling member engages in the inside of the engaging grooves 20 and 30, there is no possibility that the engaged portion will contact the exterior and come off.

INDUSTRIAL APPLICABILITY

A polycrystalline silicon rod according to present invention has a structure for hanging of polycrystalline silicon rods to each other end-to-end, so that the efficiency of melting polycrystalline silicon can be increased considerably. According to the polycrystalline processing process of the present invention and the polycrystalline silicon rod formed by the processing process, processing for forming grooves for coupling silicon rods made of polycrystalline silicon to each other can be performed without subjecting the silicon rods to annealing treatment so that contamination with metal can be avoided. Further, since the annealing treatment is unnecessary, the processing process can be simplified considerably so that processing for forming grooves and the like can be performed speedily. Furthermore, no heating appliance for annealing treatment is necessary so that processing costs can be reduced.

The invention claimed is:

1. A silicon rod assembly comprising a pair of polycrystalline silicon rods having a structure for hanging of silicon rods to each other end-to-end, wherein an engaging groove is formed on both end face of the rods facing to each other, the engaging groove being defined by a slit having a narrow width and an inner space larger than the width of the slit, said slit being open on an end face of the rod and said inner space being open on a side face of the rod for receiving a coupling member having both end portions, the coupling member having both ends part larger than the width of the slit being received into said engaging groove, whereby both rods can be engaged by fitting said coupling member into the respective engaging groove of both rods facing to each other.

2. The silicon rod assembly according to claim 1, wherein the entire or a part of a peripheral portion, or both shoulder portions of at least one silicon rod, are removed to leave a central portion, the engaging groove being defined a slit having a narrow width and an inner space larger than the width of the slit is formed in the central portion, and the coupling member having both ends part larger than the width of the slit is received into said engaging groove.

3. The silicon rod assembly according to claim 1, wherein the peripheral portion in an amount corresponding to 10 to 60% of a diameter of the rod end portion, a part of the peripheral portion, or both shoulder portions, are removed to leave the central portion, and said engaging groove is formed in the central portion.

4. The silicon rod assembly according to claim 1,
wherein the engaging has an inner space having a spherical, polygonal or
dovetail groove-like shape and/or
wherein a taper is formed on the boundary portion between the slit and the inner space of the engaging groove.

5. The silicon rod assembly according to claim 1,
wherein the engaging groove has an inner space having a spherical, polygonal or dovetail groove-like shape and/or
wherein a taper is formed on the boundary portion between the slit and the inner space of the engaging groove and/or
wherein both shoulder portions of a rod end portion are removed to leave the central portion, and an engaging groove penetrating the cross section of the central portion is formed therein.

6. A coupling member having both ends part larger than the width of the slit being received into the engaging groove, in order to engage both silicon rods of the silicon rod assembly according to claim 1, wherein said engaging groove is formed on both end face of silicon rods facing to each other, the engaging groove being defined by a slit having a narrow width and an inner space larger than the width of the slit, said slit being open on an end face of the rod and said inner space being open on a side face of the rod.

* * * * *